(12) United States Patent
Oukassi et al.

(10) Patent No.: US 10,910,667 B2
(45) Date of Patent: Feb. 2, 2021

(54) MICROELECTRONIC DEVICE

(71) Applicant: Commissariat A L'Energie Atomique et aux Energies Alternatives, Paris (FR)

(72) Inventors: Sami Oukassi, Saint-Egreve (FR); Xavier Baillin, Crolles (FR)

(73) Assignee: Commissariat A L'Energie Atomique et aux Energies Alternatives, Paris (FR)

( * ) Notice: Subject to any disclaimer, the term of this patent is extended or adjusted under 35 U.S.C. 154(b) by 65 days.

(21) Appl. No.: 16/180,865

(22) Filed: Nov. 5, 2018

(65) Prior Publication Data

US 2019/0074540 A1    Mar. 7, 2019

Related U.S. Application Data

(63) Continuation of application No. 15/343,650, filed on Nov. 4, 2016, now abandoned.

(30) Foreign Application Priority Data

Nov. 6, 2015  (FR) ...................... 15 60637

(51) Int. Cl.
*H01M 10/0525* (2010.01)
*B32B 3/30* (2006.01)
(Continued)

(52) U.S. Cl.
CPC ........... *H01M 10/0525* (2013.01); *B32B 3/30* (2013.01); *B32B 7/12* (2013.01); *B81C 3/001* (2013.01);
(Continued)

(58) Field of Classification Search
None
See application file for complete search history.

(56) References Cited

U.S. PATENT DOCUMENTS 6,617,264 B1   9/2003   Hsiao et al.
6,660,614 B2   12/2003  Hirschfeld et al.
(Continued)

FOREIGN PATENT DOCUMENTS

EP        2 532 616 A1   12/2012

OTHER PUBLICATIONS

French Preliminary Search Report dated Aug. 22, 2016 in French Application 15 60637, filed on Nov. 6, 2015 ( with English Translation of Categories of Cited Documents and Written Opinion).

(Continued)

*Primary Examiner* — Christopher P Domone
(74) *Attorney, Agent, or Firm* — Oblon, McClelland, Maier & Neustadt, L.L.P.

(57) ABSTRACT

This invention relates to a microelectronic device comprising: a first support, a second support, first respective faces of the first support and second support being arranged opposite, and a sealing layer between said first faces, characterized in that the sealing layer comprises at least one layer of an ionic conductive material of formula $Li_xP_yO_zN_w$, with x strictly greater than 0 and less than or equal to 4.5, y strictly greater than 0 and less than or equal to 1, z strictly greater than 0 and less than or equal to 5.5, w greater than or equal to 0 and less than or equal to 1.

14 Claims, 5 Drawing Sheets

(51) Int. Cl.
*C03C 27/00* (2006.01)
*C03C 17/02* (2006.01)
*C03C 3/16* (2006.01)
*B81C 3/00* (2006.01)
*H01M 4/04* (2006.01)
*B32B 7/12* (2006.01)
*H01M 10/058* (2010.01)
*H01M 4/08* (2006.01)
*H01M 4/58* (2010.01)
*H01M 6/14* (2006.01)

(52) U.S. Cl.
CPC ............... *C03C 3/16* (2013.01); *C03C 17/02* (2013.01); *C03C 27/00* (2013.01); *H01M 4/0402* (2013.01); *H01M 4/08* (2013.01); *H01M 4/58* (2013.01); *H01M 6/14* (2013.01); *H01M 10/058* (2013.01); *B32B 2307/202* (2013.01); *B32B 2457/00* (2013.01); *B32B 2457/10* (2013.01); *B81C 2203/031* (2013.01); *C03C 2218/155* (2013.01)

(56) References Cited

U.S. PATENT DOCUMENTS

| | | |
|---|---|---|
| 8,481,441 B2 | 7/2013 | Mohri et al. |
| 2005/0147877 A1 | 7/2005 | Tarnowski |
| 2014/0106095 A1 | 4/2014 | Bianchi |
| 2016/0248117 A1* | 8/2016 | Liang ............... H01M 10/0562 |

OTHER PUBLICATIONS

George Wallis et al. "Field Assisted Glass-Metal Sealing", Journal of Applied Physics, vol. 40, No. 10, 1969, 5 pages.

Mary R. Reidmeyer et al. "Phosphorus oxynitride glasses", Journal of Non-Crystalline Solids 181, 1995, 14 pages.

R. Tiwari et al. "The Silicon-to-Silicon Anodic Bonding Using Sputter Deposited Intermediate Glass Layer", J. Nano-Electron. Phys. 2011, 8 pages.

* cited by examiner

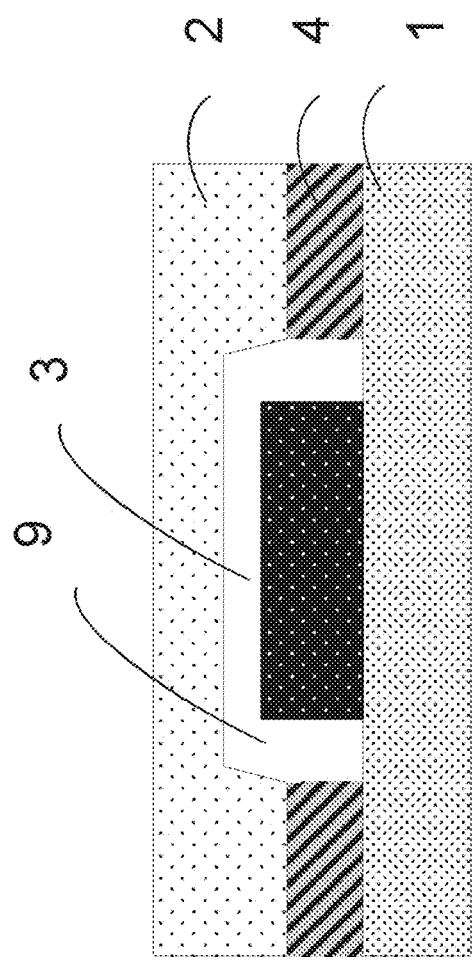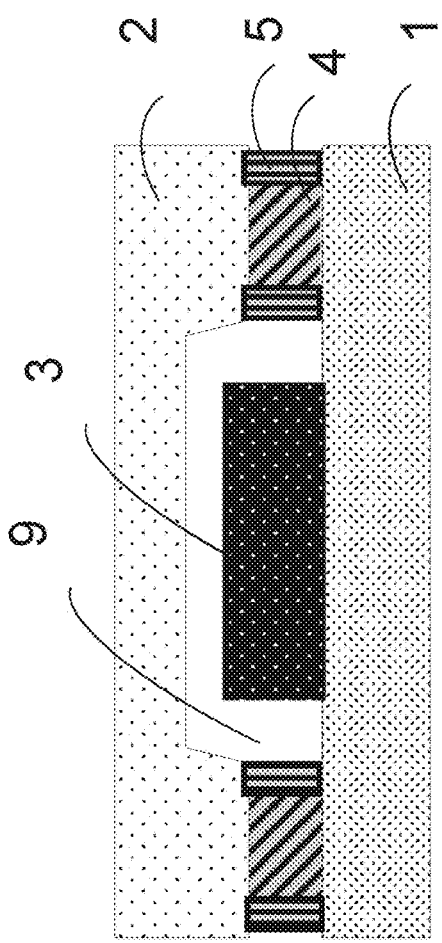

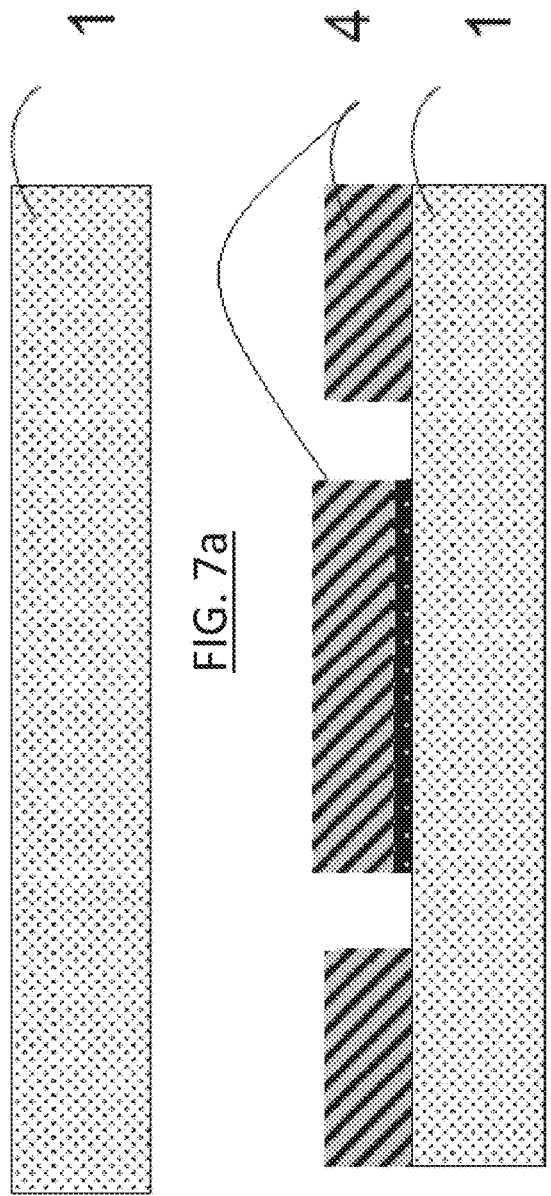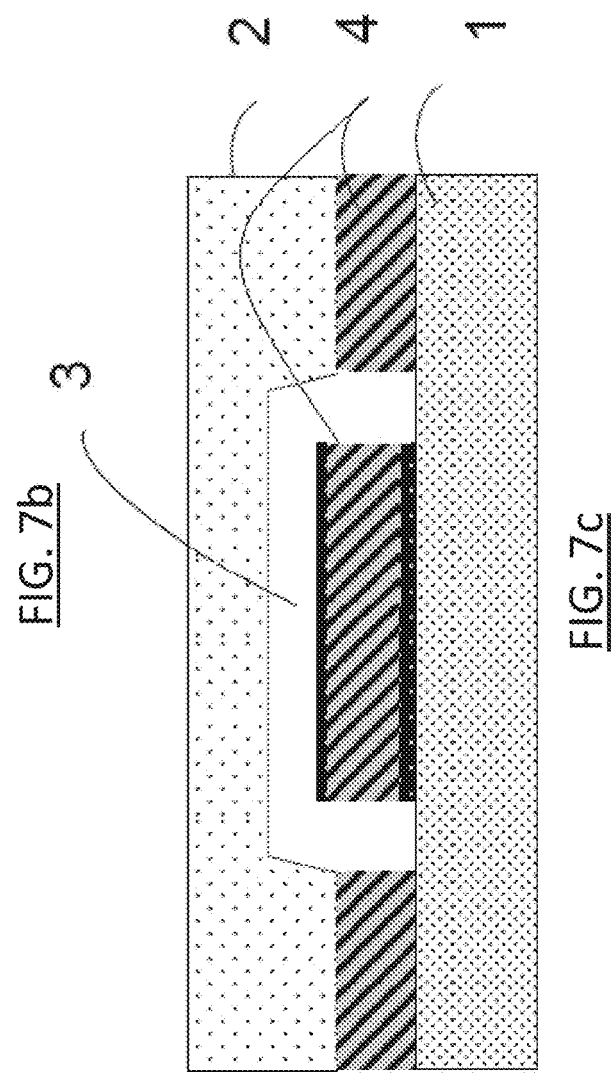

MICROELECTRONIC DEVICE

CROSS REFERENCE TO RELATED APPLICATIONS

This application is a continuation application of and claims the benefit of priority under 35 U.S.C. § 120 to U.S. application Ser. No. 15/343,650, filed on Nov. 4, 2016, and claims benefit of priority under 35 U.S.C. § 119 to France 15 60637, filed on Nov. 6, 2015, the entire contents of each of which are incorporated herein by reference.

FIELD OF THE INVENTION

This invention relates to microelectronic devices comprising a sealing, possibly reversible, with a low thermal budget. This invention is particularly interesting in the case of microelectronic devices comprising layers that are sensitive to an exterior environment such as for example air, water or oxidizing gases. The invention has in particular application in the three-dimensional (3D) assembly of electronic devices with various functionalities (mechanical, optical, optoelectronic, etc.).

TECHNOLOGICAL BACKGROUND

Generally, thin-layer microelectronic components today still comprise the bridgehead in the development of electronics. Among the most studied devices, energy storage systems such as lithium-based micro-batteries, energy recovery systems such as organic photovoltaic cells and organic photo-detectors, display systems such as organic light-emitting diodes, or MEMS (Micro-electromechanical systems) and/or NEMS (Nano-electromechanical systems).

The common problem with these circuits and the active layers that comprise them, resides in their rapid degradation in particular when they are not in a vacuum and for example in the presence of oxidizing gases of the atmosphere, or humidity. In particular, MEMS and/or NEMS generally require being encapsulated under a controlled pressure in order to obtain optimum operation (accelerometers, gyrometers, bolometers). These electronic components, for the most part, carry encapsulation solutions in order to be protected from oxidizing and corrosive elements present in the surrounding atmosphere or generally from gases present in the ambient atmosphere.

The principle of an encapsulation is generally based on the realization of a hermetic cavity of which the atmosphere is controlled (vacuum, pressure, gas).

This so-called heterogeneous encapsulation is considered to be one of the most reliable solutions in order to meet the needs of the devices or microelectronic components that are sensitive to air. The main motivations for this mode of encapsulation reside primarily in its facility of implementation, its low cost and its performance (barrier, mechanics, adherence, thermal), compared to monolithic encapsulation solutions. In this technology, the encapsulation system can be carried out separately before adding it onto the support containing the active layers forming the microelectronic device. As such, the hermetic cavity can be defined, for example, by a cover added and sealed on a substrate containing sensitive active layers. Whether they are monolithic or heterogeneous, the first function of an encapsulation solution is to protect the microelectronic device from the external environment.

Anodic bonding is a method of assembly reported in 1969 par G. D. Wallis and al. (Wallis G. D., Pomerantz D. J. Field assisted glass-metal sealing. J. Appl. Physics, 1969, vol. 40, no. 10, pp. 3946-3949). This method has since then largely developed for applications linked to micro-sensors, in particular for the carrying out of hermetic sealing or the transfer of layers from one substrate to another. Anodic bonding is a method that makes it possible to assemble in a strong and permanent manner, for example, an element made of glass to a metal, a semi-conductor or an oxide. It is based on an electrochemical mechanism for the forming of covalent bonds using oxygen anions $O_2^-$. In practice, this entails putting two surfaces into contact, for example glass and silicon. At a temperature between 200° C. and 500° C. and by applying a strong negative voltage on the glass (200-1000V), the migration of the $Na^+$ and $O_2^-$ ions is caused. The anions of oxygen can then react with the silicon in order to form Si—O—Si bonds.

The main parameters of the method of anodic bonding are: the voltage applied to the structure, for example about 1000 volts, the bonding temperature, for example between 200° C. and 500° C., the composition of the glass, the surface condition of the elements to be assembled, the pressure applied for the putting into contact of the elements to be bonded.

Anodic bonding has several advantages, for example the excellent mechanical properties of the permanent bonding permanent induced, as well as the high level of hermeticity obtained in the vacuum sealings carried out by this technique.

However, anodic bonding has certain disadvantages, of which the high voltage and temperature levels applied. The high values of these parameters prevents a compatibility of the method anodic bonding with the carrying out of sensitive components (which degrade at high temperatures and/or under the action of substantial electrical fields), for example micro-batteries, electrochromic components, organic light-emitting diodes, etc.

Prior art mainly has two approaches adopted with the purpose of reducing the voltage and/or the temperature. A first approach consists in reducing the path travelled by the ions during the method. This method reverts to reducing the thickness of the glass (thinning) or to using a thin layer of the glass considered (deposition). This requires a reduction in the voltage required for the anodic bonding. An approach that is additional or complementary to the aforementioned one, consists in selecting an ion with a higher mobility in the glass matrix (for a given temperature), for example $Li^+$ instead of $Na^+$. This results in lowering the bonding temperature.

The document U.S. Pat. No. 6,660,614B2 describes a method of anodic bonding between a substrate of glass and a semi-conductor substrate comprising a step of immersing the glass substrate in a meted salt bath in order to carry out an $Na^+/Li^+$ ionic exchange. The method described as such makes it possible to locally replace $Na^+$ ions with $Li^+$ ions that have more substantial mobility in glass. This method makes it possible to carry out bonding at temperatures between 200 and 250° C., by applying voltages between 760 and 2000 Volts. These values however remain high with respect to the specifications for sensitive components.

Document U.S. Pat. No. 8,481,441B2 describes a method of anodic bonding that implements one of the two substrates made of ceramic having $Li^+$ ions, not $Na^+$ ions. This here entails completely replacing conventional ions, in general $Na^+$, with ions that have a higher mobility, here $Li^+$. This method makes it possible to carry out bonding at temperatures of about 300° C., higher than the limits of certain sensitive components.

The document of Tiwari et al, J. Nano-Electron. Phys. 3 (2011) No 1, P. 418-425 describes a method of anodic bonding of two substrates made of silicon by using an intermediate layer of 3 microns of borosilicate glass of the Pyrex type. In this approach, this entails reducing the thickness of the glass. This method makes it possible in particular to carry out anodic bonding at 400° C., by applying voltages as low as 50 Volts. The temperatures remain high in this case, for a compatibility with sensitive components.

Document U.S. Pat. No. 6,617,264B1 describes an SOG layer (acronym for "spin on glass") comprising several elements—in particular ions of alkali metals (of which Li, Na, or K)—and which is used as an intermediate layer for anodic bonding. This approach combines the effects of the reduction in the glass thickness and the selection of ions with high mobility. The method described makes it possible to obtain bonding at temperatures between 300° and 350° C., i.e. much higher than the target specifications.

The solution describes in the invention proposes to overcome among others, at least partially, these problems. As such, an object of this invention is to provide a method for carrying out an encapsulation system that overcomes at least partially some of the disadvantages of the existing methods. In particular, an object of this invention is to describe a method of anodic bonding compatible with the carrying out of sensitive components.

SUMMARY OF THE INVENTION

This invention relates to, according to an aspect, a microelectronic device comprising: a first support, a second support, first respective faces of the first support and second support being arranged opposite, and a sealing layer between said first faces.

Particularly advantageously, the sealing layer comprises at least one layer of an ionic conductive material of formula $Li_xP_yO_zN_w$, with x strictly greater than 0 and less than or equal to 4.5, y strictly greater than 0 and less than or equal to 1, z strictly greater than 0 and less than or equal to 5.5, w greater than or equal to 0 and less than or equal to 1.

This invention also relates to, according to certain aspects, a method of carrying out a microelectronic device comprising a first support, a second support, first respective faces of the first support and second support being arranged opposite, with the method comprising a step of forming a sealing layer between said first faces. Particularly advantageously, the sealing layer comprises at least one layer of an ionic conductive material of formula $Li_xP_yO_zN_w$, with x strictly greater than 0 and less than or equal to 4.5, y strictly greater than 0 and less than or equal to 1, z strictly greater than 0 and less than or equal to 5.5, w greater than or equal to 0 and less than or equal to 1.

This invention also relates to the use of an ionic conductive material of formula $Li_xP_yO_zN_w$, with x strictly greater than 0 and less than or equal to 4.5, y strictly greater than 0 and less than or equal to 1, z strictly greater than 0 and less than or equal to 5.5, w greater than or equal to 0 and less than or equal to 1, as a sealing layer for the assembly of a first support and of a second support.

An aspect of this invention consists as such in carrying out an anodic bonding by using an ionic conductive sealing layer, of formula $Li_xP_yO_zN_w$. Advantageously, using this ionic conductive layer makes it possible to reduce the thickness of the support, for example a glass, while still increasing the mobility of the associated ions (here the lithium $Li^+$ ions).

The introduction of the sealing layer in the method of anodic bonding according to this invention provides a certain number of advantages among which: a high ionic conductivity at ambient temperature (typically between 0.5 to 3 $\mu S \cdot cm^{-1}$ for $Li^+$) about 100 times greater than that of prior art, a chemical compatibility of the supports (for example, made of glass, silicon or semi-conductor materials), a possibility of adjusting the thermal expanding coefficient according to the composition (for example, of nitrogen N in the compound $Li_xP_yO_zN_w$), as well as a compatibility with standard deposition/structuring steps in the field of microelectronics.

Through its high ionic conductivity, the sealing layer makes it possible to have a high mobility of $Li^+$ ions. This characteristic of the material, associated with its thin layer configuration, has for consequence to reduce the temperature and the voltage applied during the method of anodic bonding. The mobility of the ions is of course very high at ambient temperature, which limits the need for heating during the bonding. Moreover, the voltage necessary for the electrochemical reaction is slow in that the migration takes place at the scale of the thin layer, not at the scale of a solid substrate.

Particularly advantageously, this invention makes it possible to carry out an anodic bonding at temperatures and voltages that are lower than those required in prior art. In particular, anodic bonding is, for example, carried out at a temperature less than 150° C., for a voltage less than 100 volts.

This invention proposes an encapsulation solution for devices that are sensitive to air based on the principle of hermetic cavity overcoming at least partially the disadvantages of prior art. As such, this invention allows for high performance encapsulation, without deterioration of the encapsulated component, while still facilitating the steps of integrating and of assembling the device.

BRIEF INTRODUCTION OF THE FIGURES

Other characteristics, purposes and advantages of this invention shall appear when reading the following detailed description, along with the annexed drawings, provided as non-limiting examples, and wherein:

FIG. 2 shows a cross-section view of a first support whereon a component is positioned, and of a second support, separated by a sealing layer; with the component being encapsulated in a cavity delimited by the first support, the second support and the sealing layer.

FIG. 3 shows a cross-section view of a particular embodiment showing the presence of a barrier layer positioned on the flanks of the sealing layer internal and external to the cavity.

FIGS. 7a, 7b and 7c show another embodiment of the invention.

Figure 1A:
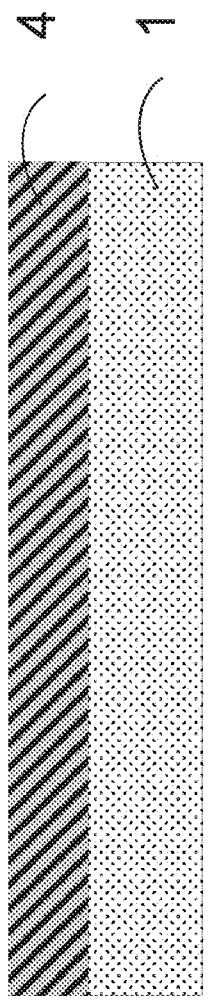
FIG. 1A shows a cross-section view of a first support whereon a sealing layer is deposited.

The drawings are provided by way of examples and do not limit the invention. They consist of block diagrams intended to facilitate the comprehension of the invention and are not necessarily to the scale of practical applications. In particular, the relative thicknesses of the various layers and substrates may not be representative of reality.

DETAILED DESCRIPTION

Before beginning a detailed review of the embodiments of the invention, hereinafter are mentioned optional characteristics that may be used according to any combination or alternatively:

- The device is such that at least one among the first support 1 and the second support 2 carries on its first face at least one electronic component 3;
- it comprises a hermetic cavity 9 delimited by the first face of the first support 1, the first face of the second support 2 and the sealing layer 4, said at least electronic component 3, being encapsulated in said cavity 9;
- with the cavity 9 comprising a getter;
- the electronic component 3 comprises a layer of $Li_xP_yO_zN_w$ formed from the same layer of an ionic conductive material of formula $Li_xP_yO_zN_w$ as the sealing layer 4, more preferably in order form one among: a micro-battery, an electrochromic component;
- the sealing layer 4 forms a closed contour;
- the device comprises a barrier layer 5; with at least one portion of the barrier layer 5 being arranged on an external flank of the sealing layer 4;
- a portion of the barrier layer 5 is arranged on an internal flank of the sealing layer 4;
- the barrier layer 5 comprises an insulating dielectric material;
- an intermediate barrier layer 6 is positioned between two portions of the sealing layer 4;
- at least one among the parameters x, y, z, w of the compound $Li_xP_yO_zN_w$ can change in the thickness of the sealing layer 4;
- a composition gradient w/y changes from a minimum value on a bonding interface of the sealing layer 4 in contact with one among the first and the second supports 1, 2 having the highest thermal expansion coefficient to a maximum value on a bonding interface of the sealing layer in contact with the other support among the first and the second supports 1, 2 having the least expansion coefficient.
- The device comprises a second sealing layer 42 pour assembler the first support 1 with a second additional support 22; the second sealing layer 42 comprises at least one layer of an ionic conductive material of formula $Li_{x1}P_{y1}O_{z1}N_{w1}$, with x1 strictly greater than 0 and less than or equal to 4.5, y1 strictly greater than 0 and less than or equal to 1, z1 strictly greater than 0 and less than or equal to 5.5, w1 greater than or equal to 0 and less than or equal to 1;
- the sealing layer 4 and the second sealing layer 42 have different chemical compositions;
- the second sealing layer 42 has a thickness less than 5 microns, preferably less than 2 microns;
- the sealing layer 4 a thickness less than 5 microns, preferably less than 2 microns;
- at least one support among the first support 1 and the second support 2 has a hollow on its first face.
- the first support 1 and/or the second support 2 are/is formed from a material with a base of glass, doped or non-doped semi-conductor, metal or a semi-conductor comprising a metal layer.
- after the formation of the sealing layer 4, an anodic bonding is carried out by applying a voltage less than 100 volts and/or a temperature less than 150° C.;
- the step of forming the sealing layer is configured in such a way as to form a hermetic cavity 9 delimited by the first face of the first support 1, the first face of the second support 2 and the sealing layer 4;
- at least one among the first support 1 and the second support 2 carries on its first face at least one electronic component 3, in such a way that the component 3 is encapsulated in said cavity 9;
- at least one layer of the component 3 is formed from the layer of an ionic conductive material of formula $Li_xP_yO_zN_w$ of the sealing layer 4.
- a getter is formed in the cavity 9;
- the step of forming the sealing layer 4 comprises the formation of a barrier layer 5; with the barrier layer 5 being arranged on an external flank of the sealing layer 4.
- the barrier layer 5 is arranged on an internal flank of the sealing layer 4;
- an intermediate barrier layer 6 is formed in such a way that it is positioned between two portions of the sealing layer 4;
- at least one from the parameters x, y, z, w of the compound $Li_xP_yO_zN_w$ can change in the thickness of the sealing layer 4;
- a composition gradient w/y is formed that changes from a minimum value on a boding interface of the sealing layer 4 in contact with one among the first and the second supports having the highest thermal expansion coefficient to a maximum value on a boding interface of the sealing layer in contact with the other support among the first and the second supports having the least expansion coefficient.
- a second sealing layer is formed in order to assemble the first support with a second additional support; the second sealing layer comprises at least one layer of an ionic conductive material of formula $Li_{x1}P_{y1}O_{z1}N_{w1}$, with x1 strictly greater than 0 and less than or equal to 4.5, y1 strictly greater than 0 and less than or equal to 1, z1 strictly greater than 0 and less than or equal to 5.5, w1 greater than or equal to 0 and less than or equal to 1;

It is specified that, in the framework of this invention, the term "on" does not necessarily mean "in contact with".

As such, for example, the deposition of a layer on another layer, does not necessarily mean that the two layers are directly in contact with one another but this means that one of the layers at least partially covers the other by being either directly in contact with it, or by being separated from it by a film, another layer or another element.

It is also specified that, in the framework of this invention, the thickness of a layer is measured according to a direction perpendicular to the surface according to which this layer has its maximum extension. Typically, when the layers form cylinder portions, their thickness is taken according to a direction perpendicular to the two faces forming disks. In FIG. 2 for example, the thickness is taken according to the vertical.

The invention relates to a method for carrying out a microelectronic device, in reference to FIGS. 1 to 6. According to the invention, microelectronic device means a device comprising elements with micronic and/or nanometric dimensions. Such a device may or may not comprise one or several components. It can also be an assembly of supports with a basis of layers of which for example a portion is made of a semiconductor material or materials.

FIG. 1A shows a cross-section view of a first support 1 on a first face of which is deposited a sealing layer 4. It is preferably meant by support, a substrate, a chip or a wafer comprising at least one chip. Is meant in particular any substrate that comprises at least one electronic element. The first support 1 can, for example, include silicon, doped silicon, a semiconductor, glass, a metal or an insulating substrate that has a metal deposition on the surface.

Advantageously, the sealing layer 4 comprises at least one layer of an ionic conductive material, of formula $Li_xP_yO_zN_w$ with $0<x\leq4.5$, $0<y\leq1$, $0<z\leq5.5$ and $0\leq w\leq1$. The sealing layer 4 possibly has a thickness less than 5 µm, preferably less than 2 µm. Preferably, this sealing layer 4 has a thickness between 0.1 and 5 microns. The sealing layer 4 is carried out in particular by deposition techniques such as: reactive spray deposition, laser ablation, chemical vapor deposition (CVD), plasma enhanced chemical vapor deposition (PECVD), metal organic chemical vapor deposition (MOCVD), or sol-gel deposition.

Figure 1B:
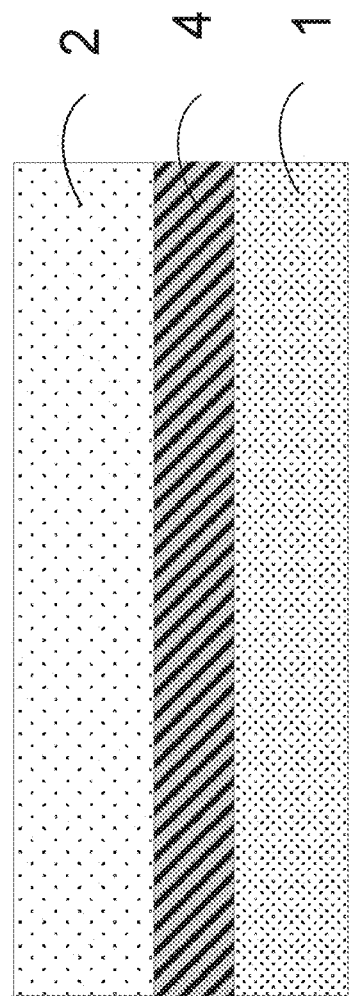
FIG. 1B shows a cross-section view of a first support and of a second support separated by a sealing layer.

A second step consists in putting into contact the first support 1 covered with the sealing layer 4 with a second support 2. FIG. 1B shows a cross-section view of a first support and of a second support separated by a sealing layer 4.

The second support 2 can, for example, include silicon, doped silicon, a semi-conductor, glass, a metal or an insulating substrate that has a metal deposition on the surface.

An anodic bonding is then carried out by applying a low voltage, preferably less than 100 volts, and/or a low temperature, preferably less than 150° C.

The first support and second support 1, 2 can be a passive substrate without an active layer, a substrate with electrical elements or a substrate with one or several components of the same nature or of different natures. The predominant criterion in the choice of the materials comprising the supports 1, 2 is dictated by the barrier properties required for the target application. These supports 1, 2 of a thickness preferentially less than 100 microns can be of a metal, ceramic, glass nature or any other material or combinations of materials that make it possible to guarantee if needed sufficient seal with respect to the oxidizing species such as for example: water $H_2O$ or/and oxygen $O_2$, or/and nitrogen $N_2$, or/and rare gases.

According to the target application, other criteria of a nature that is optical (transparence and transmittance), thermal, chemical-physical (resistance to corrosion) or mechanical can be required. Preferably, the supports 1, 2 are chosen from the wide range of different families of glasses (borofloat, borosilicates or derivatives thereof), at thicknesses in particular less than or equal to 100 microns.

In the embodiment in FIG. 1B the device of the invention does not comprise a cavity. The sealing layer is a full layer and makes it possible to seal the two supports. The objective of the invention can reside in this sealing, without the formation of a cavity. The sealing layer can for example be a full wafer or form any closed contour or not suitable for the sealing. This sealing can be of course reversible and the 2 supports can be dissociated by using mechanical stresses and/or by using a suitable thermal treatment and/or par chemical etching and/or by laser ablation of the sealing layer.

According to a preferred but not limiting embodiment of the invention, at least one component 3 is formed in the device. The steps of carrying out an electronic device, comprising at least one component 3, for example of the lithium micro-battery type, can be carried out such as shown in FIGS. 2 to 6.

Generally, the component 3 (for example, a micro-battery) is carried out by known techniques of prior art. The dimensions and the thicknesses of the layers that comprise the component 3, are given for the purposes of illustration in order to show the principles of the invention. The description provided in the rest of this document shall make reference to a particular lithium micro-battery device, with the understanding that this example is provided for the purposes of illustration and is not limiting. It can be transposed to any electronic, optical, optoelectronic, micromechanical or other component. According to particular embodiments, the component 3 is chosen from a micro-battery, an electrochromic component, a micro-sensor, or another component that integrates a sealing layer, preferably of formula $Li_xP_yO_zN_w$ in its structure.

In FIG. 2, the component 3 is encapsulated in a hermetic cavity 9 delimited by the first face of the first support 1, the first face of the second support 2 and the sealing layer 4. Advantageously, at least one support among the first support 1 and the second support 2 is hollow. The assemblage comprised by the first support 1 and the second support 2 is a mechanically solid assembly. The active layers of the component 3 are imprisoned in a perfectly hermetic cavity 9 defined by a juncture between the first support 1 and the second support 2. Optionally, the cavity 9 generated by the sealing of the second support 2 on the first support 1, comprising the component 3, can be controlled in atmosphere, by carrying out the methods of sealing under an inert gas (such as argon) or in a vacuum. A getter can be used to absorb at least partially gaseous species such as oxygen and/or nitrogen. In particular, in order to obtain a controlled pressure (nature and partial pressure of the gases), a deposition of a getter can be added that is more preferably metal as a thin layer of the NEG (Non Evaporable getter) type. The thickness of the latter can be between 0.2 and 2 µm and its composition is chosen in such a way that it is thermally activatable at a temperature compatible with the device 3. By way of example a ternary alloy Ti—Zr—V can be activated at a temperature close to 150° C., while a binary alloy with a base of Ti and/or Zr will be activatable at a higher temperature, but less than 400° C.

In the framework of this invention, the method for transferring the second support 2 onto the first support 1 is made possible by the use of sealing techniques. The principle is to provide the first support 1 with a sealing layer 4 homogeneously or in the form of a sealed seam or micro-seam, before mechanically freezing the second support 2 on the first support 1. Advantageously, the sealing material is designed in the form of sealed seam at the periphery of the first support 1, in such a way as to surround the sensitive component 3. The sealing layer 4 advantageously forms a closed contour around the at least one component 3. Advantageously, the sealing layer 4 is formed from an electrically insulating material. The shape, height, length and width of the sealing layer 4 are parameters that can be adjusted according to the nature of the devices or microelectronic components.

According to an embodiment of the invention, the thickness of the sealing layer 4 is advantageously chosen in such a way as to create a cavity 9 between the first support 1 and the second support 2 required for correct electrical functionality without altering the electrical properties of the component 3, for example a battery. The height of such a cavity 9 is defined by the difference between the thickness of the sealing layer 4 and that of the component 3, forming for example a battery. Typically, the minimum value of this height is set to around 5% of the value of the total thickness of the component 3. The dimensions (the thickness in particular) of the sealing layer 4, recommended in the embodiments, can be adjusted according to the applications. However, it must be ensured that the barrier and mechanical robustness properties are preserved.

This sealing layer 4 can be carried out on the first support 1 containing the component 3, or alternatively on the second support 2, by using the various techniques known in prior art. As an indication, dispense or screen-printing are the preferred techniques that are the most compatible with respect to the dimensions and architectures required for the sealing layer 4.

According to the recommended principles in the framework of this invention, the sealing layer 4 surrounds and delimits the active portions of the component 3.

In addition, this solution guarantees increased mechanical robustness of the assembly comprised of the microelectronic device and its packaging. This major advantage has application in the methods for the three-dimensional assembly of microelectronic components in general and more particularly the components made from ultra-thin substrates (less than 50 microns thick) requiring the use of ultra-thin encapsulation covers, such as the second support 2.

Advantageously, sealing by anodic bonding makes it possible to carry out a hermetic sealing of the component 3 sensible, without degrading the performance of said component 3.

Sealing by anodic bonding is a simple and robust method that offers a highly promising solution for the encapsulation of microelectronic devices. One of the main advantages of this technique is linked to its facility of implementation independently of the flatness of the surfaces to be bonded due to its high wetting capacities. Generally, the seal of the sealing layer 4 is the first criterion sought for the encapsulation solution by the transfer of a second support 2.

According to a particular embodiment shown in FIG. 3, a barrier layer 5 is arranged on at least one of the flanks of the sealing layer 4, Preferably, the barrier layer 5 forms at least one portion that has a closed contour closing the flank of the sealing layer 4 between the first faces of the supports 1, 2. According to an embodiment, the barrier layer 5 is arranged on the flank of the sealing layer 4 external to the cavity 9. According to another embodiment, the barrier layer 5 is arranged on the flank of the sealing layer 4 interne to the cavity 9. Preferably, the barrier layer 5 is positioned in two portions on either side of the sealing layer 4, in other words on the flanks internal and external to the cavity 9, making it possible to provide an additional barrier and to improve the hermeticity of the sealing. The barrier layer 5 comprises more preferably an insulating dielectric material. This additional layer can, for example, be an oxide, a nitride or a silicon oxinitride, an aluminum oxide or a titanium oxide deposited by CVD, PECVD or LPCVD. The barrier layer 5 is for example formed using lithographic or photolithographic techniques. The barrier layer 5 has a thickness or width according to the plane of the faces to be assembled, more preferably between 1 and 10 microns.

Figure 4:
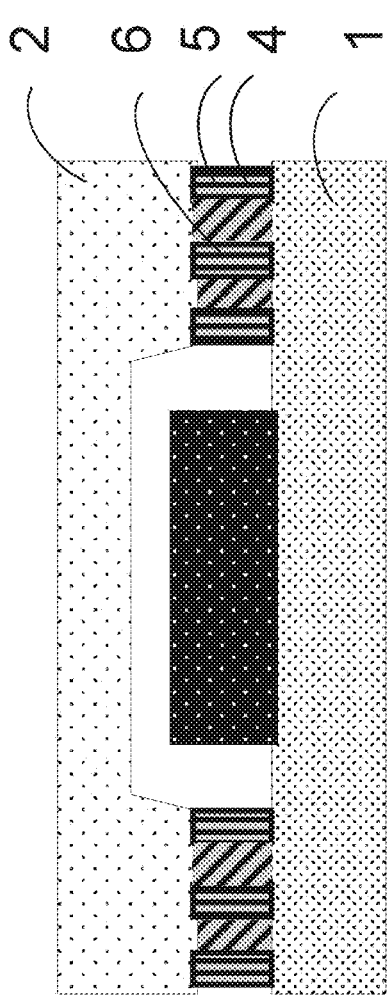
FIG. 4 shows a cross-section view of a particular embodiment showing a plurality of barrier layers.

According to an embodiment shown in FIG. 4, an intermediate barrier layer 6 is positioned between the two portions (internal and external) of the barrier layer 5 and/or between two portions of the sealing layer 4. As such, the sealing is carried out by an alternation of several motifs. The intermediate barrier layer 6 comprises more preferably an insulating dielectric material. This intermediate barrier layer 6 can, for example, be an oxide, a nitride or a silicon oxinitride, an aluminum oxide or a titanium oxide deposited by CVD, PECVD or LPCVD. The intermediate barrier layer 6 is for example formed using lithographic or photolithographic techniques. The intermediate barrier layer 6 has a thickness or width according to the plane of the faces to be assembled, more preferably between 1 and 10 microns.

The barrier layer 5 and the intermediate barrier layer 6 advantageously represent hermetic pillars of mechanical consolidation of the stack formed by the first support 1 and the second support 2. Due to their barrier properties, these partitions guarantee a lateral encapsulation of the component 3. Through its geometrical distribution, the sealing layer 4 covers, according to a preferred embodiment, the entire peripheral perimeter defined by the dimensions of the component 3. Such an arrangement of the sealing layer 4 effectively contributes to an increase mechanical robustness of the first support 1-second support 2 assembly. Preferably, there is no space between the barrier layer 5 and/or the intermediate barrier layer 6 and the sealing layer 4.

According to a non-limiting embodiment of the invention, the first support 1 is a glass substrate, for example with a borosilicate or alumina-borosilicate base.

A sealing layer 4 is then formed, of formula $Li_xP_yO_zN_w$ by a technique of reactive sputtering, using a target of $Li_3PO_4$, under a gas 100% $N_2$, in the following conditions: flow rate $N_2$ of 100 sccm (standard cubic centimeter per minute), radiofrequency power density (RF) of 4 watts/cm$^2$, deposition temperature of 150° C.

A second support 2 is then deposited, for example a substrate made of silicon. Then a putting into contact of the first support 1 and of the second support 2 is then carried out in order to form a glass/silicon structure. Anodic bonding is then carried out at a voltage of 100 volts, under a temperature of 150° C.

Phosphorus oxinitride glasses can have a variation in the thermal expansion coefficient according to their composition, in particular according to the function of the atomic percentage in nitrogen. This characteristic is implemented in the alternatives shown in FIGS. 5 and 6.

Figure 5:
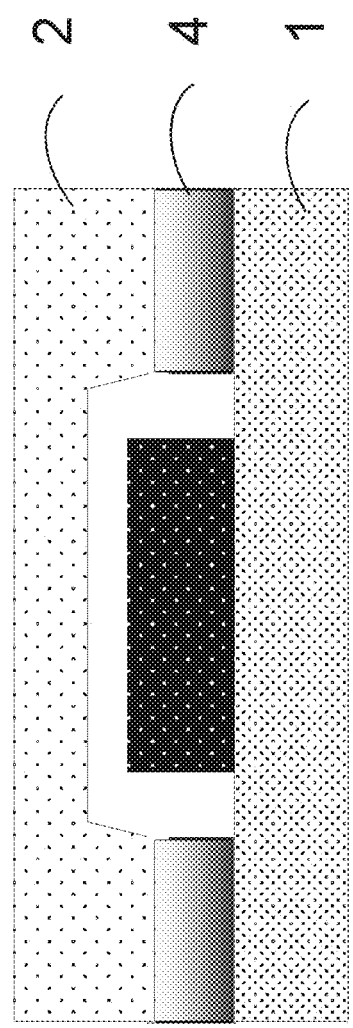
FIG. 5 shows a cross-section view of a particular embodiment wherein the sealing layer has a gradient in its chemical composition that changes in relation to its thickness.

FIG. 5 shows a first alternative consisting in carrying out a composition gradient in nitrogen in the thickness of the sealing layer 4 of formula $Li_xP_yO_zN_w$ (for example by varying the flow rate of $N_2$ during the deposition in the case of a vacuum deposition method). For example, it has been shown that an increase in the ratio N/P results in a decrease in the thermal expansion coefficient of glasses of the $Li_xP_yO_zN_w$ type (Journal of Non-Crystalline Solids 181 (1995) 201-214). The thermal expansion coefficient can for example decrease more than 30% for a ratio N/P changing from 0 to 0.8). This composition gradient (which results in a gradient in terms of thermal expansion coefficient) can attenuate the differences in the thermal expansion coefficients between two different substrates taking place during the anodic bonding. According to this embodiment, at least one among the parameters x, y, z, w of the compound $Li_xP_yO_zN_w$ changes in the thickness of the sealing layer 4.

Figure 6:
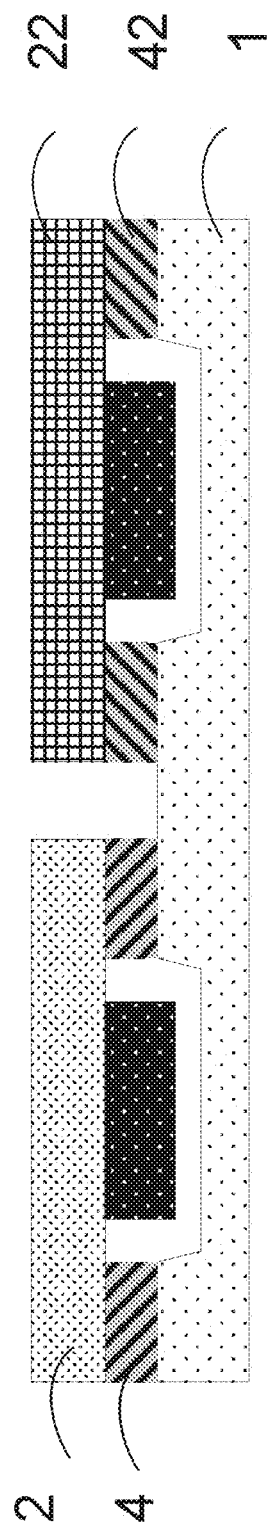
FIG. 6 shows a cross-section view of a particular embodiment where in a second support is separated from the first support by a first sealing layer and a second additional support is separated from the first support by a second sealing layer.

FIG. 6 shows a second alternative consisting in carrying out a sealing layer 4 that has at least two different compositions that translate at least two different thermal expansion coefficient on two different zones of a support 1 (for example, the center and the periphery of a wafer of silicon). This configuration makes it possible to carry out an anodic bonding between a first support 1, a second support 2 and a second additional support 22. According to an embodiment, a first sealing layer 4 assembles the first support 1 with a second support 2 and a second sealing layer 42 assembles the first support 1 with a second additional support 22. Preferably, the first sealing layer 4 and the second sealing layer 42 have different chemical compositions. Advantageously, the second sealing layer 42 comprises at least one layer of an ionic conductive material of formula $Li_xP_yO_zN_w$.

Applying a suitable temperature and voltage makes it possible to seal, in a sustainable manner, the various devices, therefore carrying out a hermetic and robust assembly with an integration that offers a reduction in the encumbrance of the packaging.

FIGS. 7a to 7c show a particular embodiment wherein a $Li_xP_yO_zN_w$ layer is common to the sealing zone and to the electronic component present on one of the two substrates (for example the substrate 1 as in FIG. 7a)

For example in the case of a micro-battery of an electrochromic component, a $Li_xP_yO_zN_w$ layer is present in the stack and plays the role of an ionic conductor. The $Li_xP_yO_zN_w$ layer can as such be deposited and structured at a single time as shown in the layer 4 deposited and having been subjected to removals in such a way as to form the desired patterns (by all typical means in particular by lithography or photolithography) and as such allows for a sealing that can be seen in FIG. 7c with a gain in terms of cost for the method. A portion of the $Li_xP_yO_zN_w$ layers is therefore used for the sealing and at least one other is used for the formation of the component 3.

The alternatives or options described in this portion stem directly from the description of the previous technological steps. They are valid for illustrative applications such as micro-batteries but can be transposed to other microelectronic components. Unless mentioned otherwise, the steps that describe the examples presented in each part are based on the same principles announced hereinabove. Particularly advantageously, the method of bonding according to this invention is suited for applications such as the hermetic sealing of sensitive components (in terms of resistance to temperature and electrical fields), for example, MEMS (acronym for "Micro-Electro-Mechanical System"), micro-batteries, electrochromic components, microsensors.

The invention claimed is:

1. A method for making a microelectronic device comprising a first support, a second support, first respective faces of the first support and the second support being arranged opposite, with the method comprising:
   forming a sealing layer between said first respective faces of the first support and the second support, wherein the sealing layer comprises at least one layer of an ionic conductive material of formula $Li_xP_yO_zN_w$, with x being greater than 0 and less than or equal to 4.5, y being greater than 0 and less than or equal to 1, z being greater than 0 and less than or equal to 5.5, w being greater than or equal to 0 and less than or equal to 1; and
   after the forming of the sealing layer, performing an anodic bonding between the sealing layer and the first face of the first support and between the sealing layer and the first face of the second support by applying a voltage less than 100 volts and/or a temperature less than 150° C.

2. The method according to claim 1, wherein the forming of the sealing layer comprises forming a hermetic cavity delimited by the first face of the first support, the first face of the second support and the sealing layer.

3. The method according to claim 1, wherein at least one among parameters x, y, z, w of the ionic conductive material of formula $Li_xP_yO_zN_w$ varies along a thickness dimension of the sealing layer.

4. A microelectronic device comprising:
   a first support;
   a second support; and
   a sealing layer comprising an ionic conductive material of formula $Li_xP_yO_zN_w$, with x being greater than 0 and less than or equal to 4.5, y being greater than 0 and less than or equal to 1, z being greater than 0 and less than or equal to 5.5, w being greater than or equal to 0 and less than or equal to 1, between and anodically bonded to the first support and the second support.

5. The method of claim 2, wherein at least one of the first face of the first support and the first face of the second support, carries at least one electronic component, and wherein the at least one electronic component is encapsulated in said hermetic cavity.

6. The method of claim 5, further comprising forming a layer of $Li_xP_yO_zN_w$ on the electronic component, said layer formed from a same ionic conductive material of formula $Li_xP_yO_zN_w$ as the sealing layer.

7. The method of claim 5, wherein the electronic component is selected among a micro-battery and an electrochromic component.

8. The method of claim 1, further comprising forming a barrier layer, wherein at least one portion of the barrier layer is disposed on an external flank of the sealing layer or on an internal flank of the sealing layer.

9. The method of claim 1, further comprising forming an intermediate barrier layer between two portions of the sealing layer.

10. The method of claim 3, further comprising forming a composition gradient w/y that changes from a minimum value on a bonding interface of the sealing layer in contact with one among the first support and the second support having a highest thermal expansion coefficient to a maximum value on a bonding interface of the sealing layer in contact with another support among the first support and the second support having a least thermal expansion coefficient.

11. The method of claim 1, further comprising
   forming a second sealing layer, wherein the second sealing layer comprises at least one layer of an ionic conductive material of formula $Li_{x1}P_{y1}O_{z1}N_{w1}$, with x1 being greater than 0 and less than or equal to 4.5, y1 being greater than 0 and less than or equal to 1, z1 being greater than 0 and less than or equal to 5.5, w1 being greater than or equal to 0 and less than or equal to 1; and
   after forming the second sealing layer, bonding the first support with a second additional support.

12. The method of claim 11, further comprising selecting different chemical compositions respectively for the sealing layer and the second sealing layer.

13. A method for making a microelectronic device comprising a first support, a second support, first respective faces of the first support and the second support being arranged opposite, with the method comprising:
   forming a sealing layer between and in contact with said first respective faces of the first support and the second support, wherein the sealing layer comprises at least one layer of an ionic conductive material of formula $Li_xP_yO_zN_w$, with x being greater than 0 and less than or equal to 4.5, y being greater than 0 and less than or equal to 1, z being greater than 0 and less than or equal to 5.5, w being greater than or equal to 0 and less than or equal to 1, and wherein, after the forming of the sealing layer, performing an anodic bonding by applying a voltage less than 100 volts and/or a temperature less than 150° C.

14. A microelectronic device comprising:

a first support;

a second support; and a layer of anodic bonding comprising an ionic conductive material of formula $Li_xP_yO_zN_w$, with x being greater than 0 and less than or equal to 4.5, y being greater than 0 and less than or equal to 1, z being greater than 0 and less than or equal to 5.5, w being greater than or equal to 0 and less than or equal to 1, between and anodically bonded to the first support and the second support.

* * * * *